US006953719B2

(12) United States Patent
Doczy et al.

(10) Patent No.: US 6,953,719 B2
(45) Date of Patent: Oct. 11, 2005

(54) INTEGRATING N-TYPE AND P-TYPE METAL GATE TRANSISTORS

(75) Inventors: Mark Doczy, Beaverton, OR (US); Justin K. Brask, Portland, OR (US); Steven J. Keating, Beaverton, OR (US); Chris E. Barns, Portland, OR (US); Brian S. Doyle, Portland, OR (US); Michael L. McSwiney, Hillsboro, OR (US); Jack T. Kavalieros, Portland, OR (US); John P. Barnak, Beaverton, OR (US)

(73) Assignee: Intel Corporation, Santa Clara, CA (US)

(*) Notice: Subject to any disclaimer, the term of this patent is extended or adjusted under 35 U.S.C. 154(b) by 0 days.

(21) Appl. No.: 10/851,360

(22) Filed: May 20, 2004

(65) Prior Publication Data

US 2004/0214385 A1 Oct. 28, 2004

Related U.S. Application Data

(62) Division of application No. 10/327,293, filed on Dec. 20, 2002.

(51) Int. Cl.[7] .................. H01L 21/8238; H01L 21/3205; H01L 21/4763
(52) U.S. Cl. ................... 438/199; 438/233; 438/585; 438/926
(58) Field of Search ................... 438/926, 199, 438/233, 183, 275, 276

(56) References Cited

U.S. PATENT DOCUMENTS

| 6,107,126 | A | * | 8/2000 | Wu ............................. 438/217 |
| 6,255,698 | B1 | | 7/2001 | Gardner et al. |
| 6,261,887 | B1 | * | 7/2001 | Rodder ....................... 438/218 |
| 6,365,450 | B1 | | 4/2002 | Kim |
| 6,410,376 | B1 | | 6/2002 | Ng et al. |
| 6,541,395 | B1 | * | 4/2003 | Trivedi et al. .............. 438/775 |
| 6,586,288 | B2 | * | 7/2003 | Kim et al. ................... 438/183 |
| 6,620,664 | B2 | * | 9/2003 | Ma et al. .................... 438/183 |
| 6,677,652 | B2 | * | 1/2004 | Lin et al. .................... 257/407 |
| 6,740,551 | B2 | * | 5/2004 | Yoshida et al. ............. 438/199 |
| 6,825,528 | B2 | * | 11/2004 | Iwata et al. ................. 257/336 |
| 2002/0058734 | A1 | | 5/2002 | Kim et al. |

FOREIGN PATENT DOCUMENTS

| EP | 0 899 784 A2 | 3/1999 |
| GB | 2 358 737 A | 8/2001 |

* cited by examiner

*Primary Examiner*—David Nelms
*Assistant Examiner*—Chuong Anh Luu
(74) *Attorney, Agent, or Firm*—Erik M. Metzger

(57) ABSTRACT

At least a p-type and n-type semiconductor device deposited upon a semiconductor wafer containing metal or metal alloy gates. More particularly, a complementary metal-oxide-semiconductor (CMOS) device is formed on a semiconductor wafer having n-type and p-type metal gates.

9 Claims, 6 Drawing Sheets

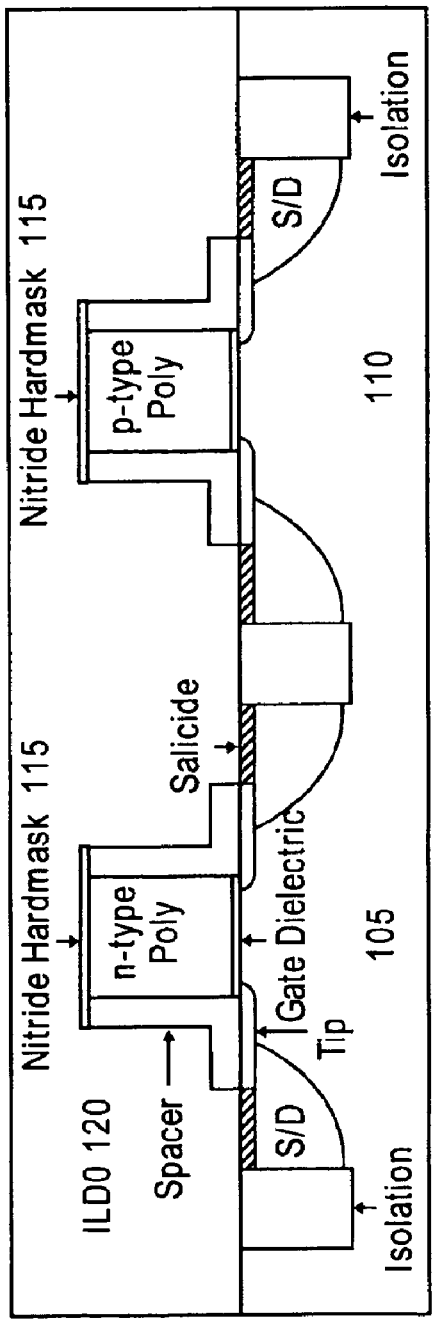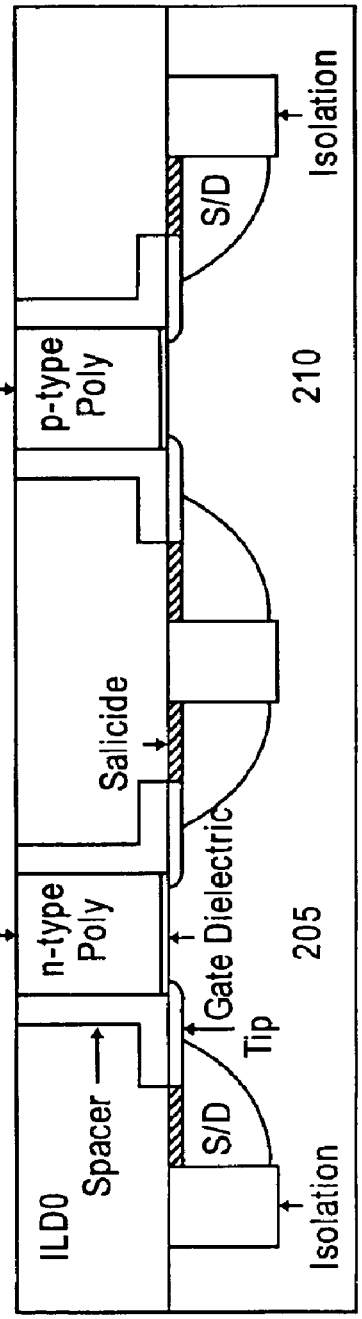

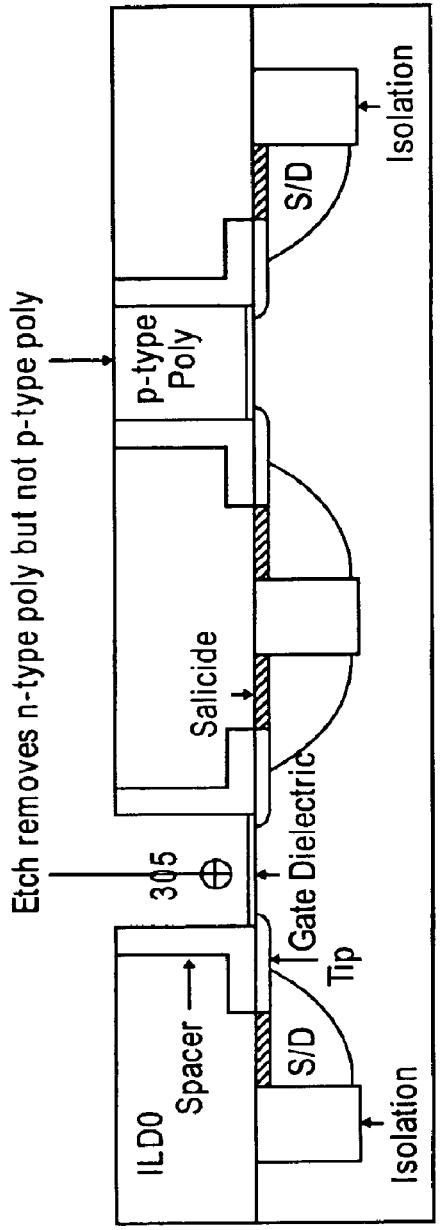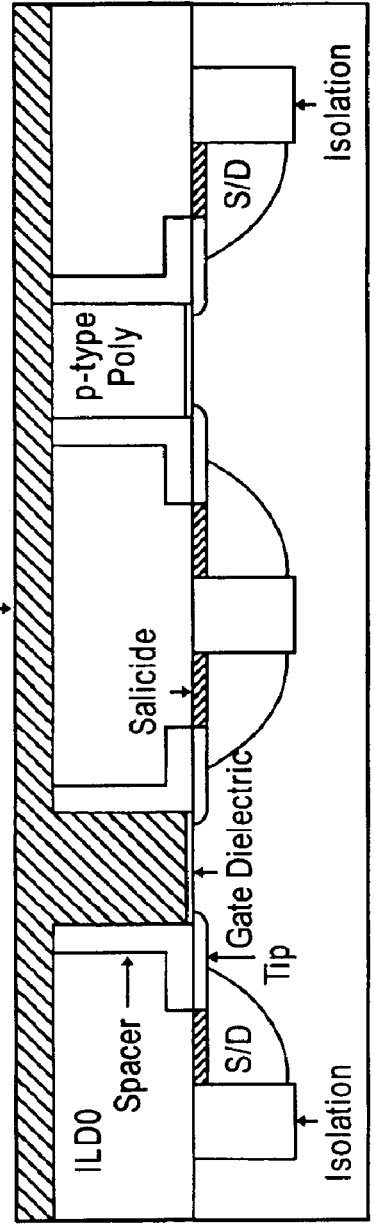
FIG. 3
FIG. 4

INTEGRATING N-TYPE AND P-TYPE METAL GATE TRANSISTORS

CROSS-REFERENCE TO RELATED APPLICATIONS

This application is a divisional of U.S. patent application Ser. No. 10/327,293, which was filed on Dec. 20, 2002.

FIELD

Embodiments of the invention relate to the manufacturing of complementary metal-oxide-semiconductor (CMOS) devices. More particularly, embodiments of the invention relate to integrating n-type and p-type metal gate transistors within a single CMOS device.

BACKGROUND

Prior art CMOS devices manufactured with prior art semiconductor processes typically have polysilicon gate structures. Polysilicon, however, can be susceptible to depletion effects, which can add to the overall gate dielectric thickness in the CMOS device. Furthermore, as the effective physical gate dielectric thickness decreases, the polysilicon depletion contributes proportionally to the total dielectric thickness. It is, therefore, desirable to eliminate polysilicon depletion in order to scale gate oxide thickness.

Metal gates, on the other hand, are not as susceptible to depletion as polysilicon and are in many ways preferable to polysilicon for forming gate structures. Typical prior art semiconductor processes, however, do not incorporate n-type and p-type metal gates within the same device or integrated circuit. This is due, in part, to the complexity and cost of developing a semiconductor process that can reliably deposit metal gate structures of differing types into the same semiconductor device or integrated circuit.

BRIEF DESCRIPTION OF THE DRAWINGS

Embodiments of the invention are illustrated by way of example and not limitation in the figures of the accompanying drawings, in which like references indicate similar elements and in which:

FIG. 1 illustrates the state of transistors after depositing ILDO according to one embodiment.

FIG. 2 illustrates the state of transistors after ILDO polish-back to expose polysilicon gate structures according to one embodiment.

FIG. 3 illustrates the state of transistors after selective n-type poly etch according to one embodiment.

FIG. 4 illustrates the state of transistors after depositing n-type metal according to one embodiment.

DETAILED DESCRIPTION

Figure 5:
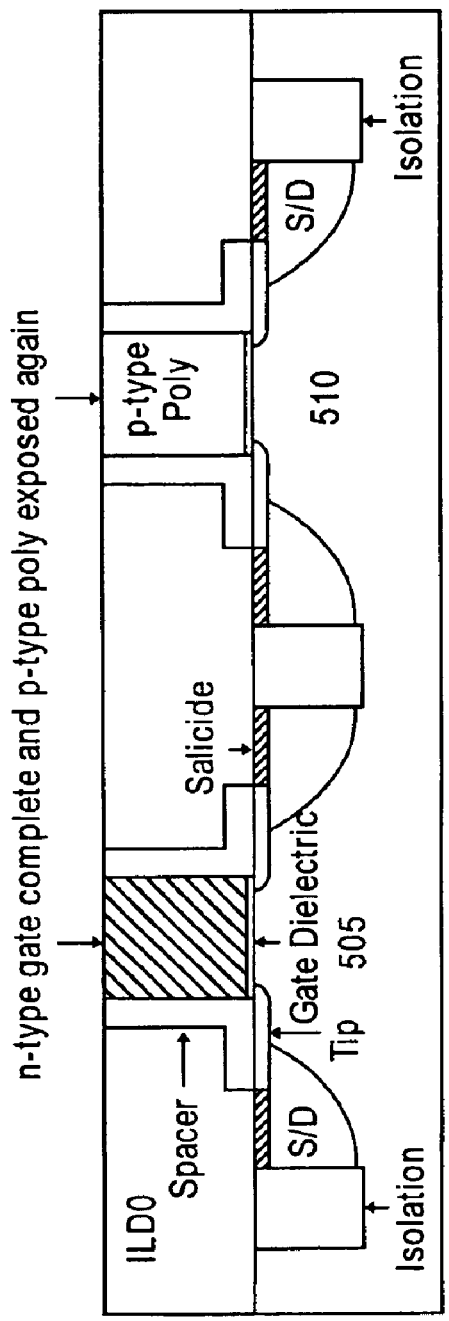
FIG. 5 illustrates the state of transistors after polishing the n-type metal according to one embodiment.

Embodiments of the invention described herein relate to semiconductor manufacturing. More particularly, embodiments of the invention described relate to integrating n-type and p-type metal gate transistors within the same complementary metal-oxide-semiconductor (CMOS) device or integrated circuit.

In order to manufacture CMOS devices and integrated circuits that can avoid the effects of gate depletion, embodiments of the invention incorporate n-type and p-type metal gates into the same CMOS device or integrated circuits.

FIG. 1 illustrates a cross-section of a CMOS device containing a p-type transistor and an n-type transistor after depositing ILDO ("Inter-layer dielectric") according to one embodiment. In FIG. 1, poly-silicon gate transistors 105, 110 are fabricated using standard CMOS processing techniques in order to prevent silicide formation on the poly-silicon gate electrode. The nitride hard masks 115 are to protect the gate structures during silicidation and ILDO 120 is deposited on the structure.

The ILDO is polished back to expose the doped polysilicon gates in FIG. 2. The ILDO polishing also removes residual silicide around the nitride masking layer. After the polysilicon gates 205, 210 are exposed, an ammonium hydroxide etch is used to selectively etch away 305 the n-type polysilicon. The ammonium hydroxide etch is low temperature (e.g., <40 deg. Celsius), uses sonication, and has a concentration of approximately 2–29%. The result of the polysilicon etch is illustrated in FIG. 3.

Removal of the p-type polysilicon above the gate dielectric creates a damascene-like "trench" which is filled with an n-type metal 405, such as Hf, Zr, Ti, Ta, or Al, as illustrated in FIG. 4. Alternatively, the trench can be filled with an alloy containing an n-type component using PVD ("Physical vapor deposition"), CVD ("Chemical vapor deposition"), or ALD ("Atomic Layer deposition"). CVD and ALD may use an organometallic or halide precursor, and a reducing atmosphere. Furthermore, the thickness of the n-type metal or alloy can be such that the trench is only partially filled. For example, the thickness of the n-type metal or alloy can vary from approximately 50 angstroms to approximately 1000 angstroms in various embodiments. If the trenches are not completely filled, they may be filled with an easily polished metal, such as W ("Tungsten") or Al ("Aluminum").

The n-type metal is polished back to create the n-type metal gates 505 and to expose the p-type polysilicon gate 510 as illustrated in FIG. 5.

Figure 6:
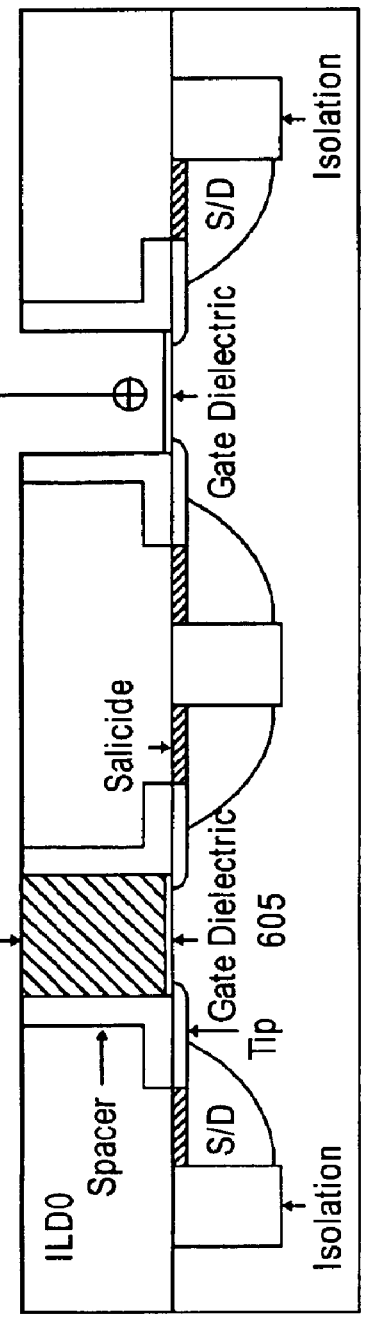
FIG. 6 illustrates the state of transistors after selectively etching p-type polysilicon according to one embodiment.

FIG. 6 illustrates the transistors after a selective dry etch is performed to remove the p-type polysilicon without removing the n-type metal gate. The selective dry etch can be performed using a parallel plate or ECR ("Electron cyclotron resonance") etcher and SF6 ("Sulfur hexafluoride"), HBr ("Hydrogen Bromide"), HI ("Hydrogen Iodide"), C12 ("Chlorine"), Ar ("Argon"), and/or He ("Helium"). Alternatively, a wet etch, such as approximately 20–30% TMAH ("Tetramethylammonium Hydroxide") at approximately 60–90 degrees Celsius with or without sonication may also be used to remove the p-type polysilicon gate.

Figure 7:
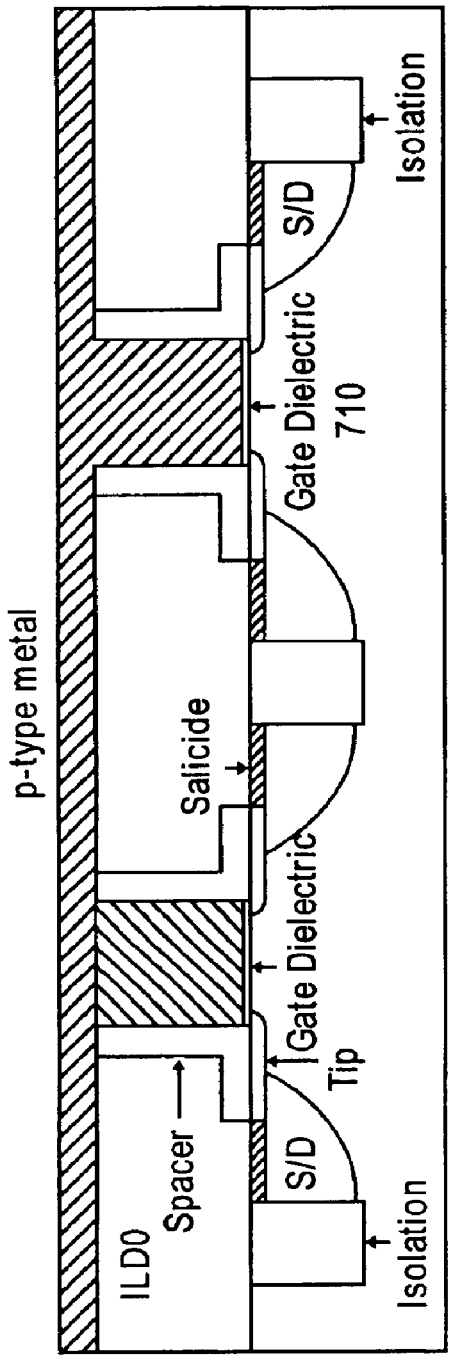
FIG. 7 illustrates the state of transistors after depositing p-type metal according to one embodiment.

A p-type metal, such as Ru ("Ruthenium"), Pd ("Palladium"), Pt ("Platinum"), Co ("Cobalt"), Ni ("Nickel"), TiAlN ("Titanium Aluminum Nitride"), or WCN ("Tungsten Carbon Nitride") can be used to fill the gate trench created by etching the p-type polysilicon gate 605. Alternatively, an alloy using p-type metal can be deposited in the trench using chemical vapor deposition or atomic layer deposition with an organometallic precursor and a reducing atmosphere. Furthermore, the thickness of the p-type metal or alloy can be such that the trench is only partially filled. FIG. 7 illustrates the transistors after the p-type metal or alloy has been deposited in the gate trench 710.

Figure 8:
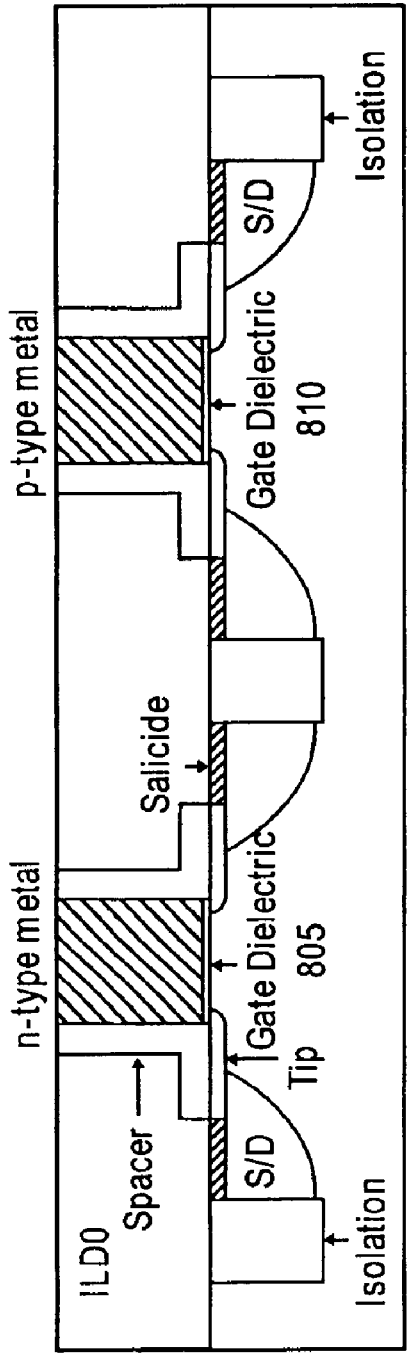
FIG. 8 illustrates the state of transistors after polishing the p-type metal according to one embodiment.

The p-type metal or alloy is polished back, as illustrated in FIG. 8, to create the p-type gate structures 805, 810, and ILDO is again deposited to provide room for the contact layer.

Figure 9:
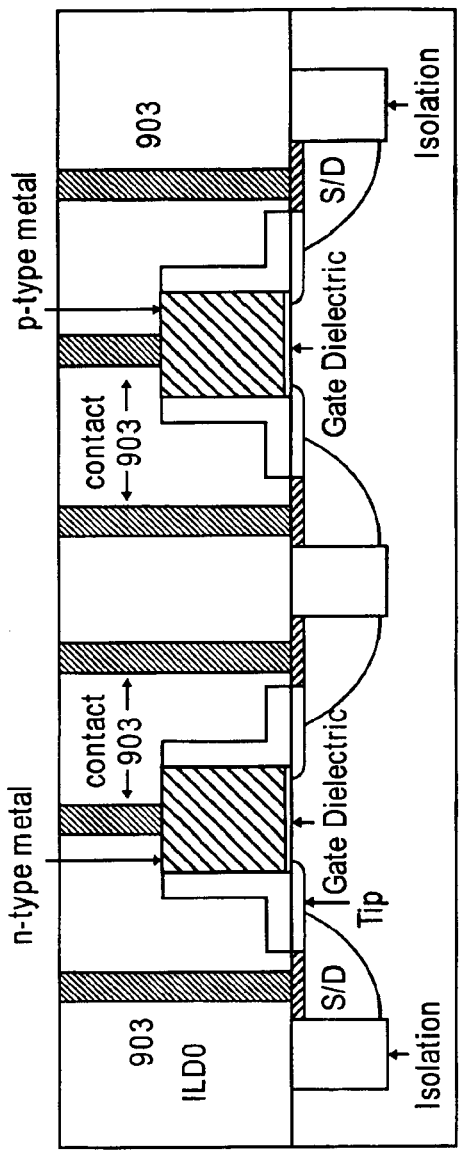
FIG. 9 illustrates the completed transistors according to one embodiment.

Contacts 903 are etched and deposited, as illustrated in FIG. 9, resulting in the final transistor structure.

Figure 10:
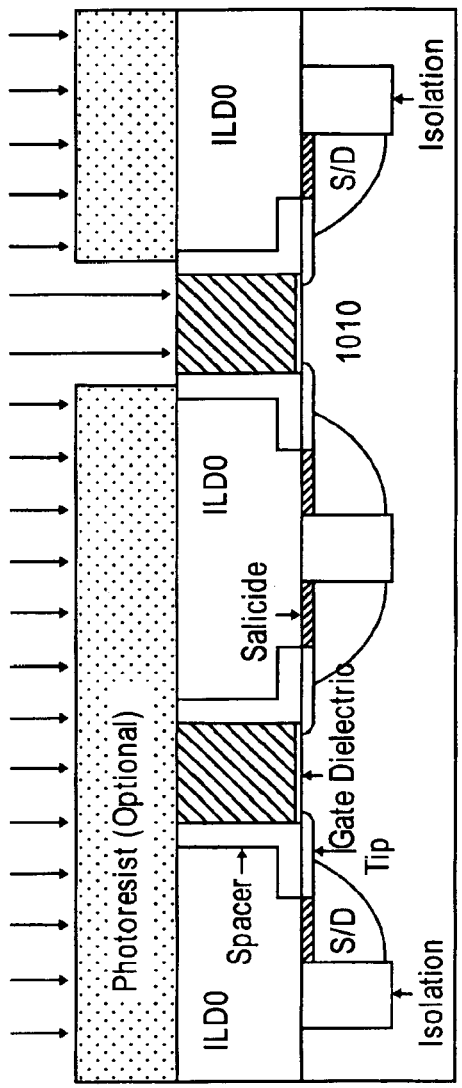
FIG. 10 illustrates the state of transistors after an optional implant patterning according to one embodiment.

Rather than using a dry etch to remove the p-type polysilicon as described above, the p-type polysilicon gate can be converted to n-type in order to allow a gentler wet etch to remove the polysilicon rather than a dry etch. For example, after the p-type polysilicon 1010 has been exposed, rather than using a selective dry etch to remove the polysilicon, an n-type implant 1015 is performed to change the doping of the polysilicon in order to allow an ammonium hydroxide etch to be performed, as illustrated in FIG. 10.

Figure 11:
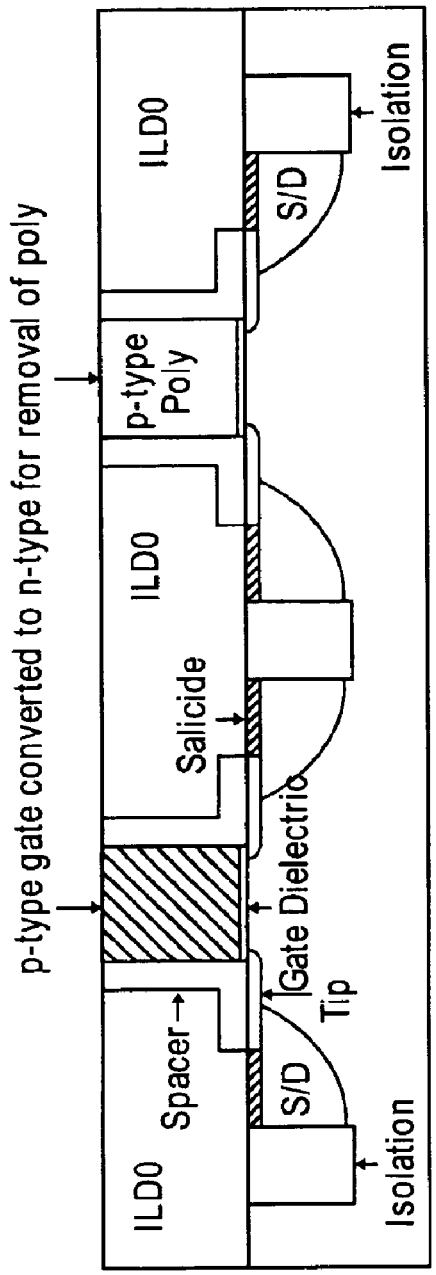
FIG. 11 illustrates the state of transistors after n-type implant and optional ash.
Figure 12:
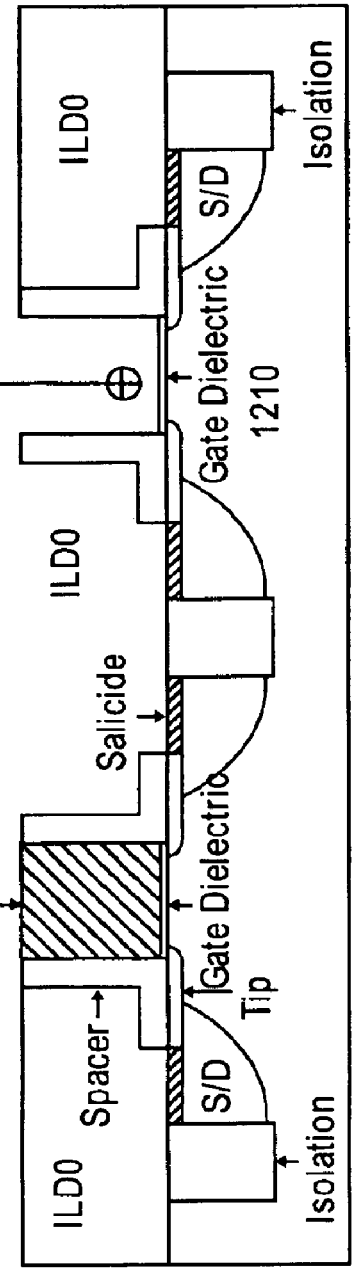
FIG. 12 illustrates the state of transistors after a second selective n-type polysilicon etch.

The result of the implant and ash (if required) is illustrated in FIG. 11. An ammonium hydroxide etch removes the remaining polysilicon gate structure 1210 resulting in the structure illustrated in FIG. 12. A p-type metal or alloy may then be deposited in the trench left by removing the p-type polysilicon gate as described above.

While the invention has been described with reference to illustrative embodiments, this description is not intended to be construed in a limiting sense. Various modifications of the illustrative embodiments, as well as other embodiments, which are apparent to persons skilled in the art to which the invention pertains are deemed to lie within the spirit and scope of the invention.

What is claimed is:

1. A process comprising:
    forming an n-type and p-type translator upon a semiconductor substrate, the n-type and p-type transistors comprising n-type and p-type polysilicon gates, respectively forming ILD0 on top of the n-type and p-type transistors:
    etching the n-type polysillcon gate to form a first trench bound in part by substantially vertical lateral side-wall spacers and a gate dielectric on the bottom of the first trench;
    depositing n-type metal into the first trench, wherein the n-type metal gate is to be doped by implanting n-type material after the metal gate has been deposited in the first trench;
    removing excess n-type gate material to expose the top of the n-type metal gate and the p-type polysilicon gate;
    etching the p-type polysilicon gate to form a second trench bound in part by substantially vertical lateral side-wall spacers and a gate dielectric on the bottom of the second trench;
    depositing a p-type metal gate within the second trench;
    removing excess n-type gate material to expose the top of the n-type metal gate and the p-type metal gate.

2. The process of claim 1 further comprising removing an ILD0 lever from the top of the polysillcon gates.

3. The process of claim 2 further comprising forming source, gate, and drain contacts to the n-type and p-type transistors.

4. The process of claim 1 wherein the n-type metal gate is selected from a group consisting of Hf, Zr, Ti, Ta, and Al.

5. The process of claim 1 wherein the p-type metal gate is selected from a group consisting of Ru, Pd, Pt, Co, Ni, TiAlN and WCN.

6. The process of claim 1 wherein the p-type metal gate and the n-type metal gate is at least 50 and no greater than 1000 angstroms thick.

7. The process of claim 1 wherein etching the n-type and p-type polysilicon gates is an ammonium hydroxide etch.

8. The process of claim 1 wherein etching the n-type and p-type polysillcon gates is performed by using a wet etch.

9. The process of claim 1 wherein the p-type metal gate is doped by implanting the metal gate with p-type material after the metal gate has been deposited into the second trench.

* * * * *